United States Patent [19]
Chu et al.

[11] Patent Number: 5,015,594
[45] Date of Patent: May 14, 1991

[54] PROCESS OF MAKING BICMOS DEVICES HAVING CLOSELY SPACED DEVICE REGIONS

[75] Inventors: Shao-Fu S. Chu; San-Mei Ku, both of Poughkeepsie; Russell C. Lange, Wappingers Falls; Joseph F. Shephard, Hopewell Junction; Paul J. Tsang, Poughkeepsie; Wen-Yuan Wang, Hopewell Junction, all of N.Y.

[73] Assignee: International Business Machines Corporation, Armonk, N.Y.

[21] Appl. No.: 261,952

[22] Filed: Oct. 24, 1988

[51] Int. Cl.$^5$ .................. H01L 21/328; H01L 21/335
[52] U.S. Cl. ........................................ 437/31; 437/34; 437/57; 437/162; 437/228; 357/43; 148/DIG. 9
[58] Field of Search ...................... 437/31, 32, 33, 56, 437/57, 58, 34, 228, 162; 357/34, 43; 148/DIG. 9

[56] References Cited

U.S. PATENT DOCUMENTS

| 4,608,589 | 8/1986 | Goth et al. | 357/34 |
| 4,686,763 | 8/1987 | Thomas et al. | 437/51 |
| 4,735,916 | 4/1988 | Homma et al. | 437/57 |
| 4,745,087 | 5/1988 | Iranmanesh | 437/69 |
| 4,800,171 | 1/1989 | Iranmanesh et al. | 437/31 |
| 4,808,548 | 2/1989 | Thomas et al. | 437/57 |
| 4,824,796 | 4/1989 | Chiu et al. | 437/57 |

OTHER PUBLICATIONS

"A Self-Aligning Polysilicon Electrode Technology (SPEL) for Future LSIS", by Y. Misawa et al. (Hitachi Research Laboratory) IEEE 1987, pp. IEDM 87-33 through IEDM 87-35.

Primary Examiner—Brian E. Hearn
Assistant Examiner—T. N. Quach
Attorney, Agent, or Firm—Jeffrey L. Brandt

[57] ABSTRACT

A method of forming a semiconductor device on a body of semiconductor material having a first doped region of a first conductivity type, comprising the steps of: forming a stud over the first doped region; using the stud as a mask to form a second doped region of a second conductivity type in the surface of the first doped region adjoining the stud; forming a sidewall of insulating material on the stud; forming a first device contact within the sidewall; and forming a second device contact over the second doped region adjoining the sidewall, such that the first and second electrical contacts are separated by the sidewall.

In accordance with an embodiment of the present invention, the step of forming the second device contact includes the steps of forming a layer of conductive material generally conformally over the first doped region and the stud, and then planarizing the layer of conductive material to a height equal to or less than that of the sidewalls. The second contact is thus self-aligned with the first and second doped regions and the first device contact.

The method of the present invention can be utilized to fabricate bipolar transistors, insulated gate transistors, and BICMOS logic including both types of transistors. It can further be used to fabricate any other type of semiconductor device which utilizes the self-aligned, closely spaced device regions and contacts of the present invention.

14 Claims, 8 Drawing Sheets

PROCESS OF MAKING BICMOS DEVICES HAVING CLOSELY SPACED DEVICE REGIONS

DESCRIPTION

The present invention relates generally to semiconductor devices and methods of fabricating the same, and more particularly to a self-aligned method for fabricating semiconductor devices using a reverse image process.

BACKGROUND OF THE INVENTION

Major efforts in the development of integrated circuit semiconductor devices have been directed towards decreasing the size and spacing of the devices and towards efficiently fabricating different families of devices on the same semiconductor chip. Extensive efforts, for example, have been directed towards the manufacture of BICMOS logic which includes both bipolar and complementary metal-oxide semiconductor devices on the same semiconductor chip. For such BICMOS logic to be successful, it must be capable of efficient manufacture, i.e. not require too many complex or expensive processing steps. Further, the finished logic circuit must provide small, densely packed, high performance devices.

One method of manufacturing semiconductor devices to provide smaller device size and decreased device spacing is that known as "lost wax" or "reverse image" processing. In such processes, a protective structure such as a stud or ridge is formed on a silicon wafer. Doping and/or various other process are performed using the protective structure as a mask. The structure is subsequently removed in the final steps of the process. Examples of such a method include: U.S. Pat. No. 4,571,817 to Birritella et al.; European Patent Application EP 0 128 751 by Toshiba; and J. Jiyamoto et al. "A 1.0 Micron N-Well CMOS/Bipolar Technology for VLSI Circuits", IEDM 1983, pgs 63-66.

The following are of interest as directed towards the manufacture of BICMOS devices: U.S. Pat. No. 4,299,024 to Piotrowski; U.S. Pat. No. 4,475,279 to Gahle; U.S. Pat. No. 4,507,847 to Sullivan; U.S. Pat. No. 4,484,388 to Iwasaki; U.S. Pat. No. 4,637,125 to Iwasaki et al.; U.S. Pat. No. 4,486,942 to Hirao; F. Walczyk, J. Rubinstein, "A Merged CMOS/Bipolar VLSI Process", IEDM 1983, pgs. 59-62; H. Higuchi et al., "Performance and Structures of Scaled-Down Bipolar Devices Merged with CMOSFETS", IEDM 1984, pgs. 684-687.

U.S. Pat. No. 4,419,809 to Riseman et al., assigned to the assignee of the present invention, uses the above-described "lost wax" method to form the drain region of a MOSFET. Riseman et al. further shows the use of sidewall technology to form a sub-micron device channel.

U.S. Pat. No. 4,508,579 to Goth et al., assigned to the assignee of the present invention, shows a method of forming lateral device structures using insulating studs formed from oxide sidewalls.

U.S. Pat. No. 4,160,991 to Anantha et al., assigned to the assignee of the present invention shows a method of forming high performance bipolar transistors having closely spaced base-emitter contacts.

In summary, a process which yields semiconductor devices having smaller or more closely spaced device regions provides a substantial contribution to the art. Such a process is of even greater value if it can be economically and efficiently implemented, particularly with different device types.

SUMMARY OF THE INVENTION

The principal object of the present invention is to provide a new and improved method of fabricating semiconductor devices.

Another object of the present invention is to provide such a method capable of fabricating small, densely packed semiconductor devices.

A further object of the present invention is to provide such a method which is economically and efficiently applicable to the fabrication of bipolar, insulated gate, and BICMOS logic devices.

Yet another object of the present invention is to provide new and improved semiconductor devices having small, densely packed device regions.

In accordance with the present invention, there is provided a new and improved method of forming a semiconductor device on a body of semiconductor material having a first doped region of a first conductivity type, comprising the steps of: forming a stud over the first doped region; using the stud as a mask to form a second doped region of a second conductivity type in the surface of the first doped region adjoining the stud; forming a sidewall of insulating material on the stud; forming a first device contact within the sidewall; and forming a second device contact over the second doped region adjoining the sidewall, such that the first and second contacts are separated by the sidewall.

In accordance with an embodiment of the present invention, the step of forming the second device contact includes the steps of forming a layer of conductive material generally conformally over the first doped region, the stud, and the sidewall, and then planarizing the layer of conductive material to a height equal to or less than that of the sidewall. The second contact is thus self-aligned with the first and second doped regions and the first device contact.

The method of the present invention can beneficially be utilized to fabricate new and improved bipolar transistors, insulated gate transistors, and BICMOS logic including both types of transistors. It can further be used to fabricate any other type of semiconductor device which utilizes the self-aligned, closely spaced device regions and contacts of the present invention.

BRIEF DESCRIPTION OF THE FIGURES

These and other objects, features, and advantages of the present invention will become apparent to the reader from a consideration of the following detailed description of the invention when read in conjunction with the drawing Figures, in which.

DETAILED DESCRIPTION OF THE INVENTION

The following detailed description of the invention is directed to a process of fabricating a BICMOS device including a pair of N- and P- channel enhancement mode CMOS devices and an NPN bipolar transistor. It will be understood that the particular conductivity types and concentration described herein are exemplary in nature. Through the reversal of conductivity types and/or the appropriate adjustment of conductivity concentrations, it will be apparent to those skilled in the art that the present invention can be used to fabricate CMOS devices of differing concentrations and/or a PNP-type bipolar transistor. It will also be understood that the present invention is not limited to the fabrication of BICMOS devices, but has utility in the fabrication of separate bipolar and insulated gate devices, as well as in the fabrication of other types of semiconductor devices requiring closely spaced, highly aligned device regions.

Figure 1:
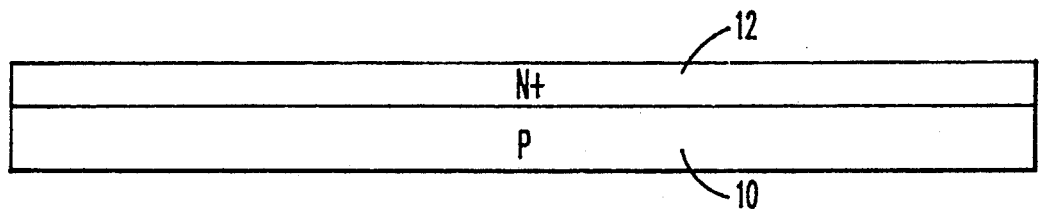
FIGS. 1–19 comprise sectional views illustrating successive process steps in constructing a BICMOS semiconductor device in accordance with the present invention, with FIGS. 11A and 14A comprising top views of the immediately preceding sectional view.

Referring now to FIG. 1, a wafer or substrate 10 of P- silicon monocrystalline material is provided, preferably having a <100>crystallographic orientation and a resistivity in the range of 10–20 ohms-centimeter. An N+ subcollector region 12 is formed in substrate 10, for example by a conventional process of implanting arsenic (As) ions to a concentration in the range of about $1 \times 10^{19} - 1 \times 10^{20}$ atoms/cm$^3$. Alternatively, N+ subcollector region 12 can be formed by conventional diffusion processes.

Figure 2:
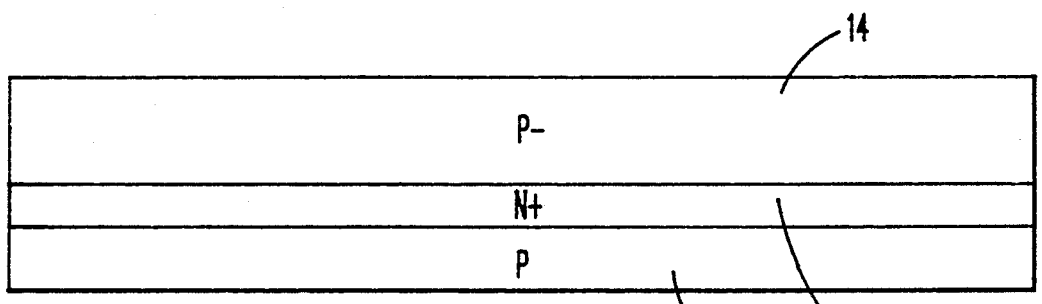

Referring now to FIG. 2, a P- epitaxial layer 14 is grown on layer 12, for example using a conventional low temperature, low pressure silicon epitaxial process. Layer 14 is preferably formed to a thickness in the range of about 0.6–1.5 microns.

Figure 3:
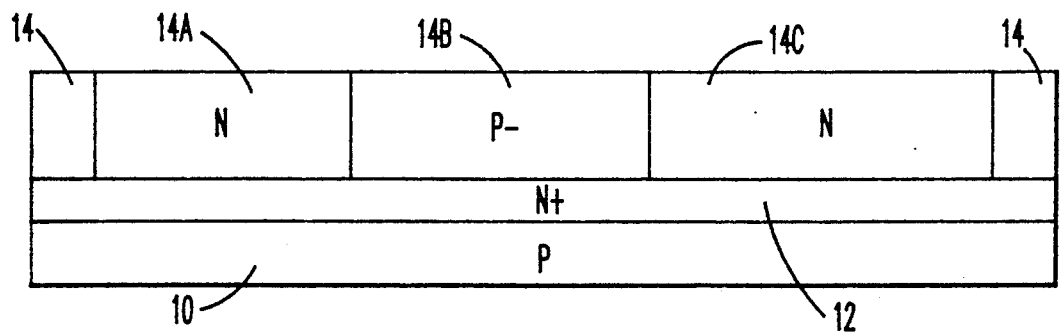

Examining now FIG. 3, a pair of N well regions 14A, 14C are formed in layer 14 so as to bound an undisturbed P- well region 14B. Regions 14A and 14C are formed, for example, by the selective implantation of arsenic or phosphorous (P) ions into layer 14 using standard photolithographic masking processes to block out region 14B. Regions 14A, 14C can be completed using conventional dopant drive-in processes.

Figure 4:
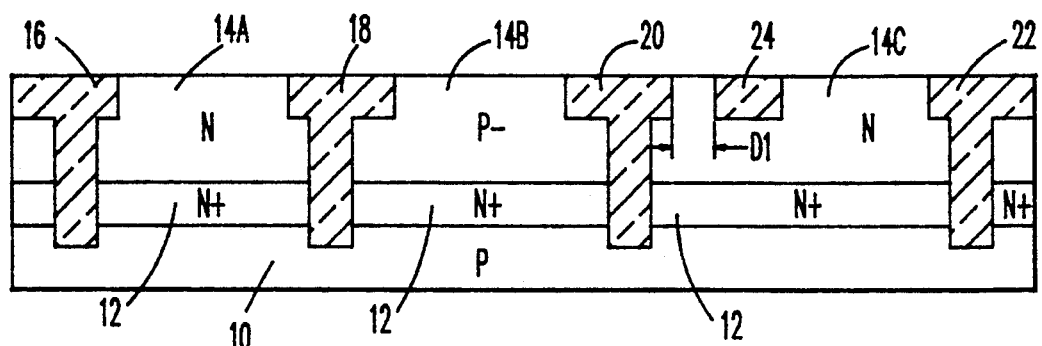

Referring now to FIG. 4, four deep isolation regions 16, 18, 20, 22 are formed at the lateral boundaries of wells 14A, 14B, 14C. In the present embodiment, each deep isolation region 16, 18, 20, 22 is generally T-shaped, including a deep trench (T-base) extending vertically downward through layer 12, and a shallow T-cap at the surface of the device extending partway into the adjoining wells. Adjacent deep isolation regions 16, 18 are used to electrically isolate a transistor device subsequently formed in well 14A. Similarly, adjacent deep isolation regions 16, 18, and 20, 22 are used to electrically isolate transistor devices subsequently formed in wells 14B and 14C, respectively. A shallow isolation region 24 is formed at the surface of well 14C, spaced laterally from the T-cap of isolation region 20 to electrically isolate subsequently formed elements of a bipolar transistor. Isolation region 24 is spaced, for example, a distance D1 in the range of about 1–10 microns from the cap of deep isolation region 20, and extends down into well 14C.

Shallow isolation region 24, as well as the T-caps of deep isolation regions 16, 18, 20, 22, can be formed, for example, using conventional recessed oxide isolation (ROI) or shallow trench isolation processes. Subsequent to the formation of the T-caps of deep isolation regions 16, 18, 20, 22, the deep trenches are formed, for example, by conventional SiO$_2$ or polysilicon filled deep trench isolation methods. The above-described methods of forming shallow and deep isolation regions are well known to those skilled in the art, and may be reversed as desired to form the deep trench regions first.

Figure 5:
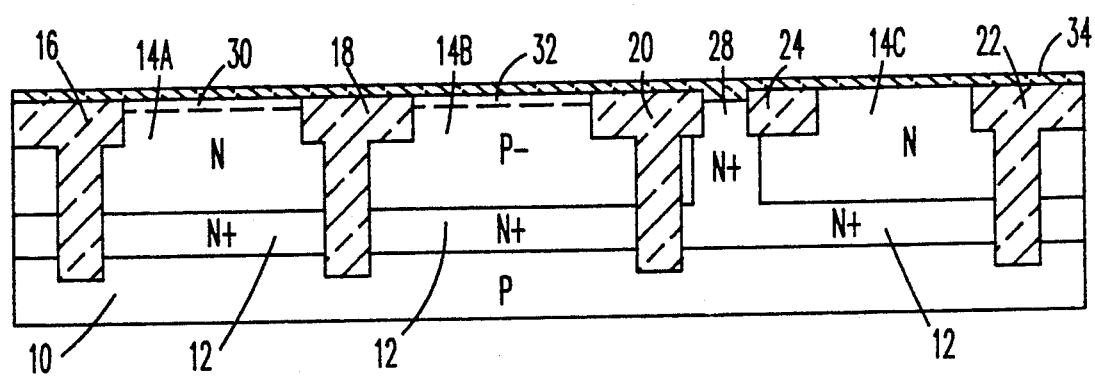

Referring now to FIG. 5, an N+ subcollector reachthrough region 28 is formed between isolation regions 20, 24 extending downward from the upper surface of well 14C into subcollector layer 12. Region 28 is formed, for example, by a conventional process of diffusing POCl$_3$ into well 14C between isolation regions 20, 24. This diffusion process is followed by a conventional oxidation process such as thermal oxidation in a wet oxygen ambient. This diffusion process drives the phosphorous dopant downward to complete subcollector reachthrough region 28, and forms an oxide layer 34 on the surface of the device. Oxide layer 34 is formed, for example, to a thickness of about 100–500 Angstroms, the layer being appreciably thicker at the surface of subcollector reachthrough region 28.

Referring still to FIG. 5, the surface conductivities of wells 14A, 14B are adjusted where MOS transistors are to be formed, so as to provide desired threshold voltages $V_T$ for these transistors. For the P-channel MOSFET to be formed in well 14A, for example, depending on whether the transistor is desired to operate in an enhancement or depletion mode, boron or phosphorous ions, or both, are selectively implanted shallowly into the surface of the well to form a region 30 with a dosage in the range of about $1-10 \times 10^{12}$/cm$^2$. For the N-channel MOSFET to be formed in well 14B, for example, boron ions are selectively implanted shallowly into the surface of the well to a dosage in the range of about $1-5 \times 10^{12}$/cm$^2$.

Figure 6:
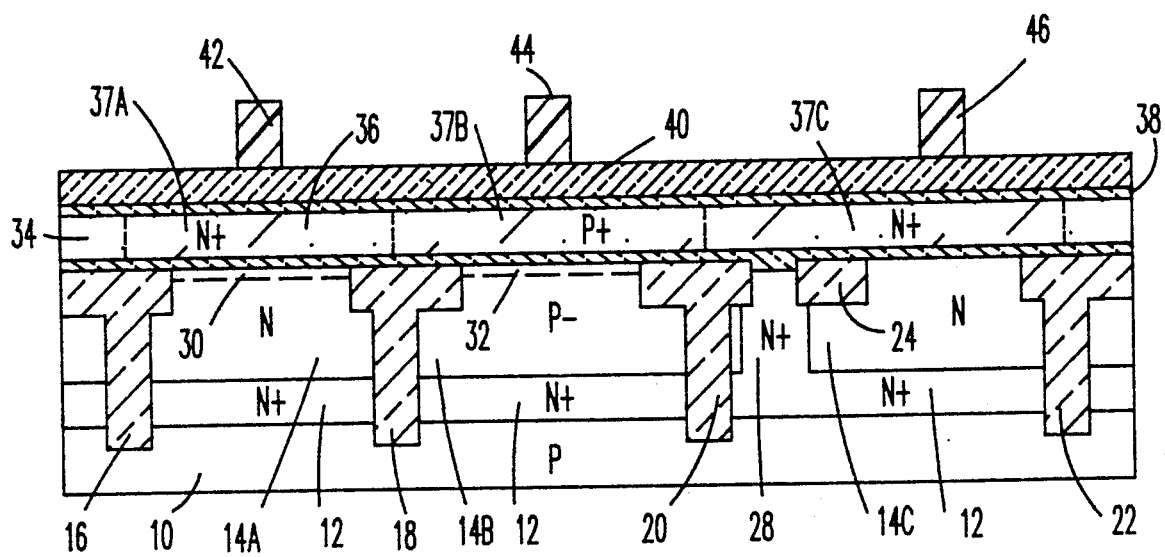

Referring now to FIG. 6, a layer 36 of conductive material is formed over layer 34. For the purposes of the present invention, suitable conductive materials for layer 36 include high-temperature, high-conductivity conductors such as conductive polysilicon, polycide (comprising polysilicon with a metal silicide coating), and refractory metals such as tungsten silicide (WSi$_2$). In a preferred embodiment of the invention, layer 36 comprises an intrinsic (non-doped) polycrystalline silicon (polysilicon) formed by a conventional chemical vapor deposition (CVD) process to a thickness in the range of about 2,000–6,000 Angstroms.

Subsequent to the formation of layer 36, regions 37A, 37C of the layer, overlying wells 14A, 14C, respectively, are doped to N+concentrations using conventional, selective As or P ion implantation. Similarly, a region 37B of layer 36, overlying well 14B, is doped to P+using conventional, selective boron ion implantation. Alternatively, if it is desired to simplify the fabrication process, polysilicon layer 36 can be formed in situ doped to an N+ concentration in the range of not less than $2 \times 10^{20}$ atoms/cm$^3$.

Subsequent to the formation of layer 36, an optional layer 38 of silicon dioxide can be formed thereon by a conventional CVD process. When used, layer 38 is preferably formed to a thickness of about 100–500 Angstroms, and functions to facilitate the delineation of the studs described below, and to relieve interlayer stresses between layer 36 and a subsequently formed nitride layer 40. Nitride layer 40 is formed, for example, by a conventional CVD process to a thickness in the range of about 1,000–2,000 Angstroms.

Subsequent to the formation of layers 34, 36, 38, 40, a conventional photolithographic process is used to form resist mask regions 42, 44, 46. Mask regions 42, 44 are centered over regions in wells 14A, 14B, respectively, which will subsequently form the gates of completed CMOS transistors. Mask region 46 is centered over the surface of well 14C (i.e. the surface between the edges of isolation regions 22, 24), a region which will subsequently form the emitter of a completed bipolar transistor.

Figure 7:
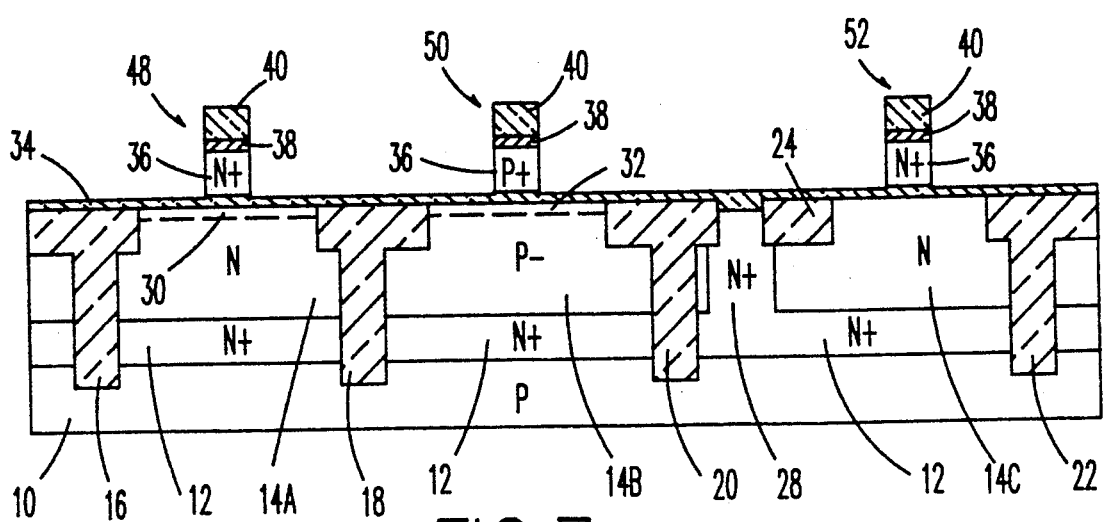

Referring now to FIG. 7, the portions of layers 36, 38, and 40 not covered by resist mask regions 42, 44, 46 are removed via appropriate reactive ion etching processes, i.e. processes having good selectivity and anisotropy, to expose underlying oxide layer 34. Appropriate RIE etchants include: $CF_4+O_2$ to remove silicon nitride layer 40; $CF_4+H_2$ to remove silicon dioxide layer 38; and $Cl_2+Ar$ or $CF_4+O_2$ to remove polysilicon layer 36. The resist mask regions 42, 44, 46 are then stripped with an oxide plasma to delineate studs 48, 50, 52 over wells 14A, 14B, 14C, respectively. With the doping of layer 36 performed as described above, the portions of the layer remaining in studs 48, 50, 52 are doped to N+, P+, N+, respectively. If layer 36 had been formed in situ doped N+ in accordance with the alternate embodiment described above, these same portions would be doped to N+.

Figure 8:
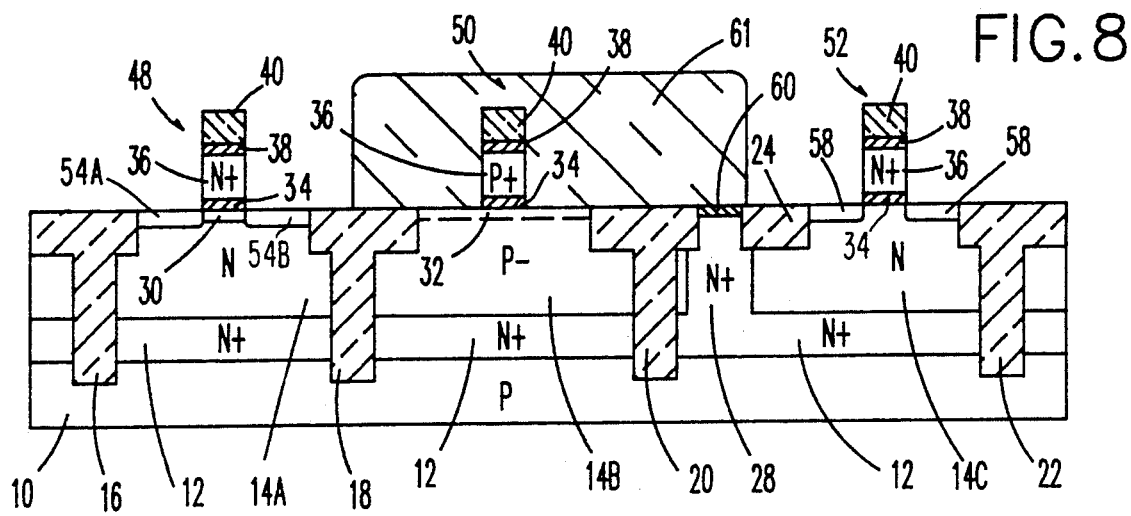

Referring now to FIG. 8, oxide layer 34 outside the regions of studs 48, 50, 52 is removed, for example through the use of a carbon tetrafluoride ($CF_4$) plasma etch or a diluted, buffered hydroflouric acid etch. Because layer 38 was thicker at the surface of subcollector reachthrough 28 than over the remainder of the device surface, a protective portion 60 of the oxide remains after the above-described etch. Subsequent to the removal of layer 34, a photolithographic blocking mask 61 is formed over the surface of the device between isolation regions 18 and 24 so as to mask the surface of well 14B. A conventional, blanket boron ion implantation is then performed with a dose in the range of $1 \times 10^{12}$ atoms/cm$^3$ to $1 \times 10^{13}$ atoms/cm$^3$. This boron ion implantation converts the surface region of well 14A not underneath stud 48 into P type lightly doped drain (LDD) regions 54A, 54B, and the surface region of well 14C not underneath stud 52 into P type intrinsic-/extrinsic base link-up region 58.

Figure 9:
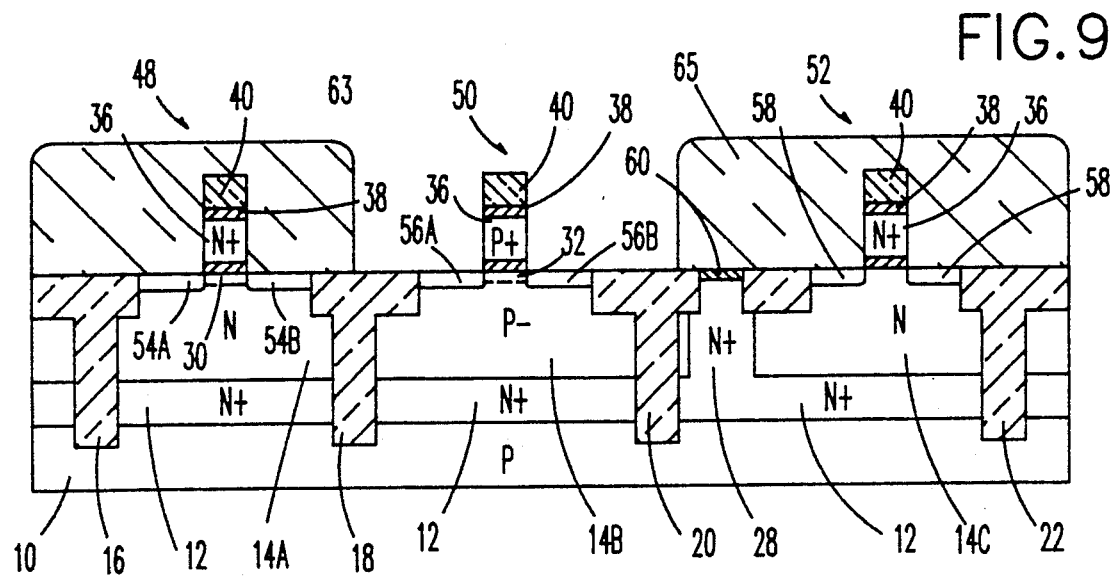
Figure 10:
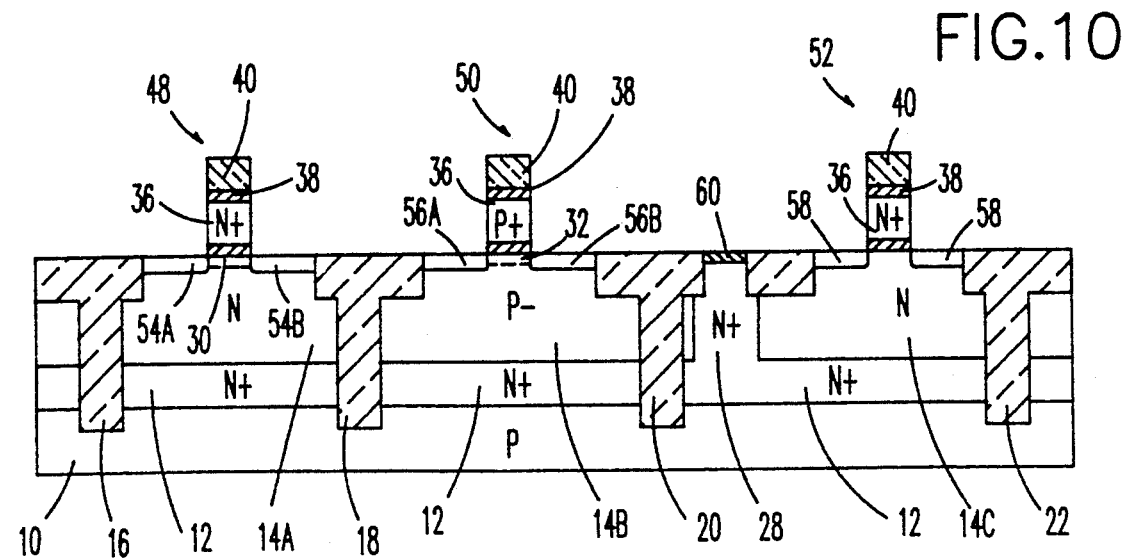

As shown in FIG. 9, a pair of photolithographic blocking masks 63, 65 are formed over wells 14A, 14C, respectively. Subsequently, a conventional, blanket arsenic ion implantation is performed with a dose in the range of $1-10 \times 10^{13}$ atoms/cm$^2$. This implantation converts the surface region of well 14B not underneath stud 50 into N type LDD regions 56A, 56B. The resulting device with the photolithographic masks removed is shown in FIG. 10.

Figure 11:
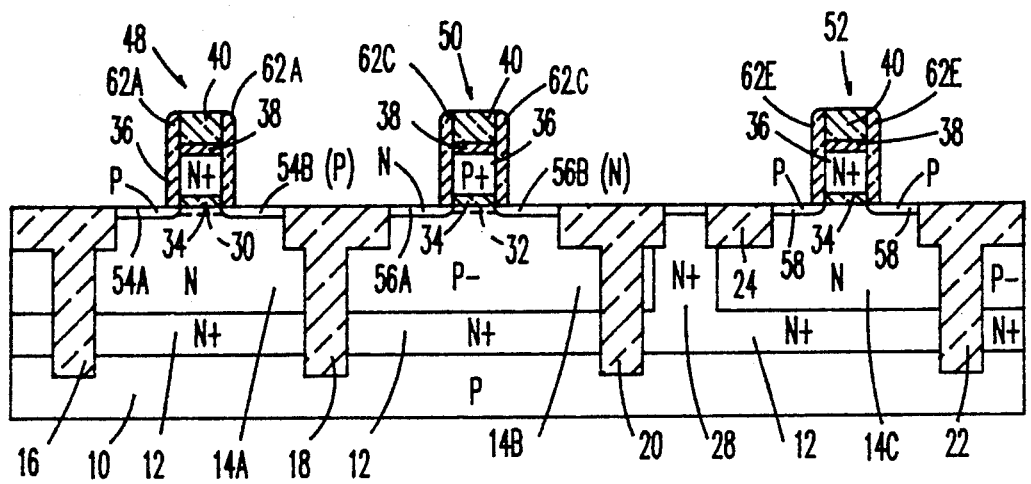
Figure 11A:
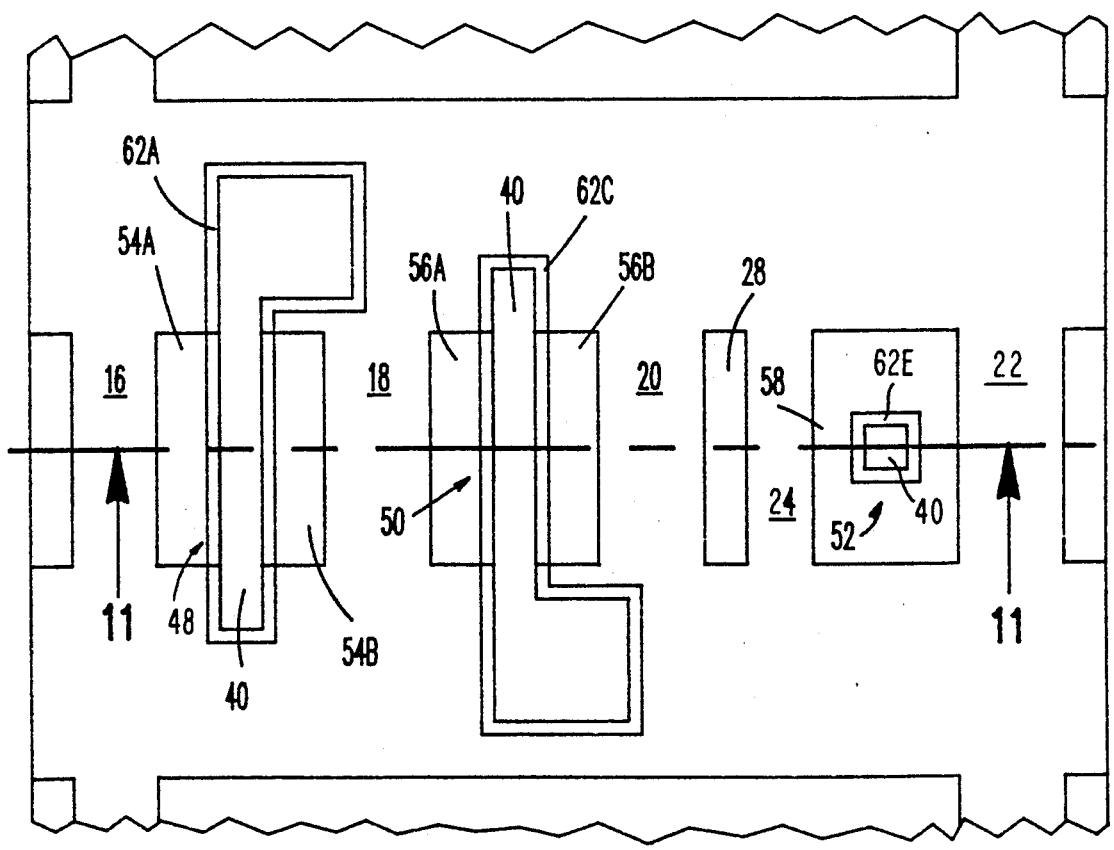

Referring now to FIG. 11, subsequent to the completion of the various ion implantations to form the above-described LDD and link-up regions, silicon dioxide sidewalls 62 are formed on the sides of each of studs 48, 50, 52. For purposes of explanation, the sidewall 62 formed on stud 48 is designated with the suffix A, the sidewall formed on stud 50 is designated with the suffix C, and the sidewall formed about stud 52 is indicated with the suffix E. From a consideration of the top view in FIG. 11A, it will be appreciated that studs 48, 50 completely bisect what will be the active regions of the subsequently formed CMOS transistors. Thus, LDD regions 54A, 54B, 56A, 56B comprise electrically separate regions spaced by the studs 48, 50, respectively. Stud 52, however, is situated with its sidewall 62E entirely within what will be the active region of the subsequently formed bipolar transistor. Link-up region 58 thus comprises a unitary electrical region surrounding stud 58.

Sidewalls 62 are formed, for exampke, by first using a conventional CVD process to form a conformal layer of $SiO_2$ (not shown) to a thickness in the range of about 1,000–5,000 Angstroms. Subsequent to the formation of this conformal layer of $SiO_2$, an anisotropic RIE etchant such as $CF_4+O_2$ is used to remove the horizontal portions of the layer, leaving vertical sidewalls 62.

Figure 12:
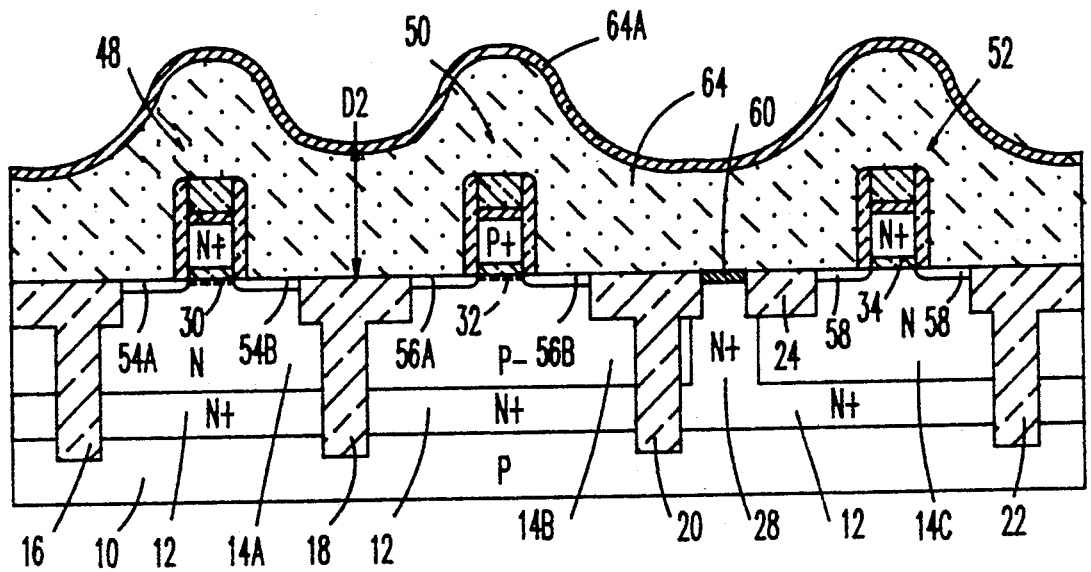

Referring now to FIG. 12, a layer 64 of polycide with accompanying metal silicide surface 64A is deposited conformally over the top of the device to a thickness D2 of at least the vertical height of sidewalls 62, or since the sidewalls cover the vertical surfaces of studs 48, 50, 52, the height of the studs. Layer 64 is formed, for example, by a conventional low pressure CVD process.

Figure 13:
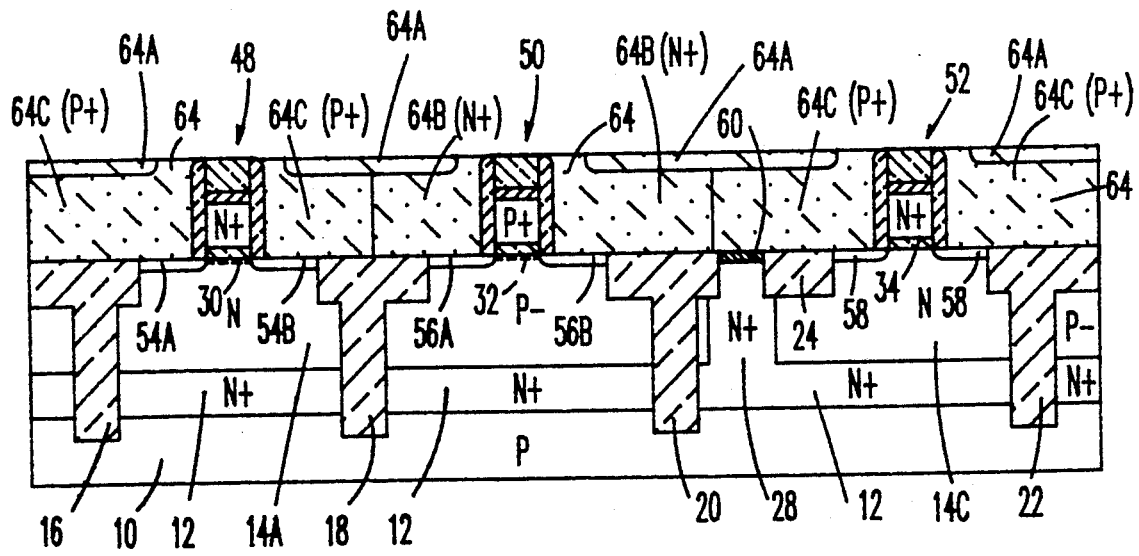

Subsequent to the formation of layer 64, the layer is planarized evenly with the tops of sidewalls 62 and studs 48, 50, 52 to form the device shown in FIG. 13. This planarization is accomplished, for example, by the use of a photoresist reflow and RIE etch-back process or by a chemical-mechanical (chem-mech) polish. An acceptable chemical-mechanical polish process is shown in U.S. Pat. No. 3,911,562 to Youmans, incorporated herein by reference.

An exemplary photoresist reflow and RIE etch-back process is shown in the article "A Practical Trench Isolation Technology with a Novel Planarization Process", to Fuse et al., IEDM 1987, pgs. 732–734 (incorporated herein by reference). Briefly, the article describes a process wherein large valleys in the $SiO_2$ are filled with a first photoresist. A thin layer of $SiO_2$ is sputtered over the entire device, and a planarizing layer of second photoresist deposited over the sputtered $SiO_2$. The second photoresist is etched to the surface of the sputter-deposited $SiO_2$. The sputter-deposited $SiO_2$, resist films, and underlying $SiO_2$ are subsequently etched to the desired height with a gas of $CHF_3$, $C_2F_6$, and $O_2$.

After the planarization of layer 64, regions 64B of layer 64 surrounding stud 50 are selectively doped with arsenic (As), while regions 64C of layer 64 surrounding studs 48 and 52 are selectively doped with boron. Both regions 64B and 64C are doped to a concentration in the range of about $1-10 \times 10^{20}$ atoms/cm$^3$. Both of these dopings are performed using conventional ion implantation processes with conventional photolithographic masking.

Figure 14:
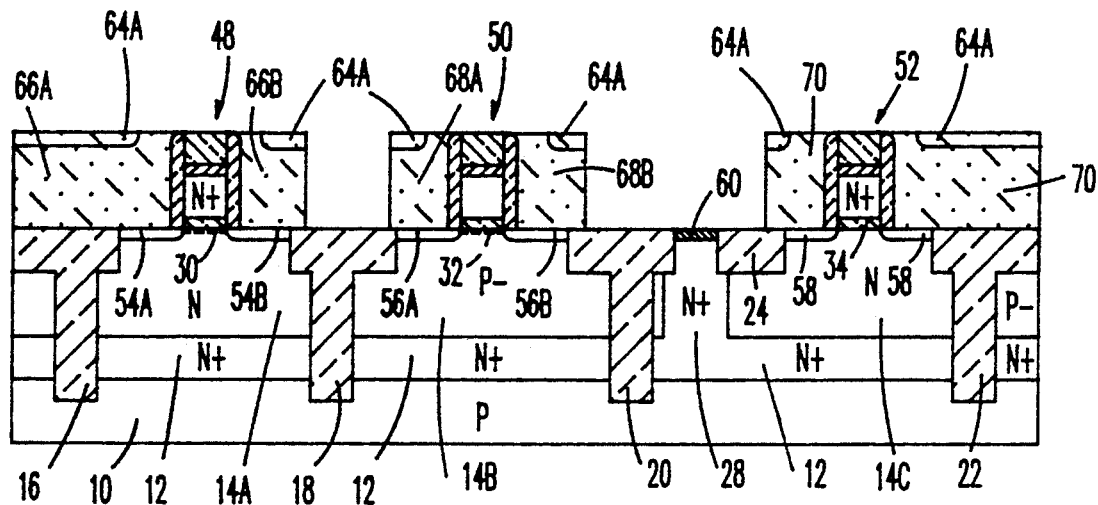
Figure 14A:
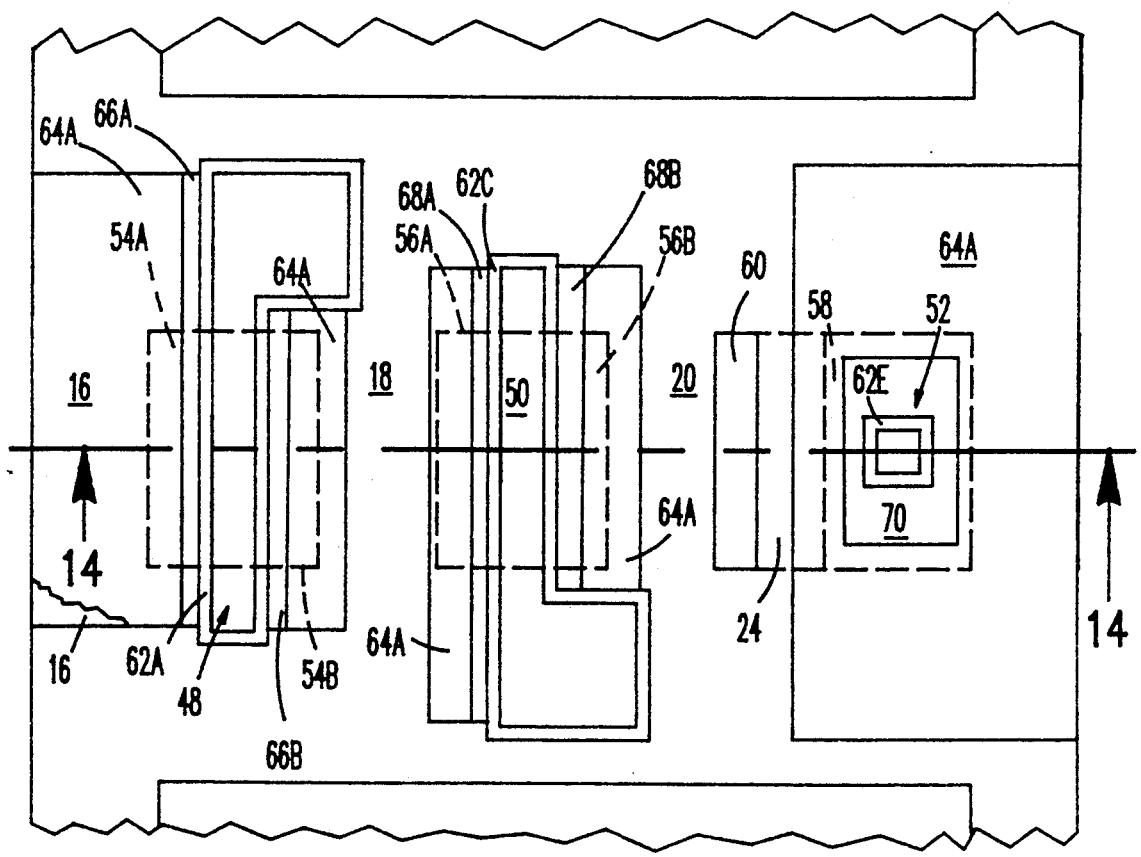

Referring now to FIGS. 14, 14A, layer 64 is delineated to form five discrete regions which, for purposes of explanation, are indicated by reference numbers 66A, 66B, 68A, 68B, and 70, region 70 forming a rectangular ring about stud 52 and sidewall 62E. Regions 66A, 66B adjoin opposite sidewalls of stud 48, the former overlying LDD implant region 54A and the latter extending from the edge of isolation trench 18 to overlie LDD implant region 54B. Regions 68A, 68B adjoin opposite sidewalls of stud 50, with the former extending from an edge of isolation trench 18 to overlie LDD implant region 56A, and the latter extending from an edge of isolation region 20 to overlie LDD implant region 56B. Region 70 forms a ring about the sidewalls of stud 52, with the left half (as viewed in the Figs.) extending from an edge of isolation trench 24 to overlie intrinsic-extrinsic base link-up region 58, and the right half extending from an edge of isolation trench 22 to overlie the other side of the link-up region.

The delineation of layer 64 to form regions 66, 68, and 70 as shown in FIG. 14 is accomplished, for example, by the use of an appropriate RIE etchant such as $CF_4+H_2$ in combination with conventional photolithographic masking.

Figure 15:
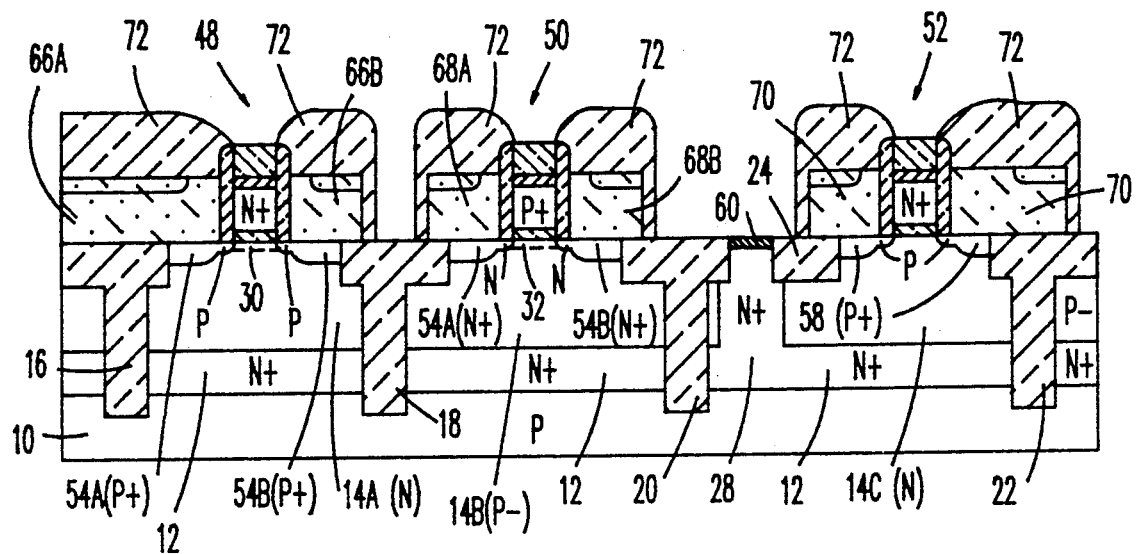

Referring now to FIG. 15, subsequent to the delineation of regions 66A, 66B, 68A, 68B, and 70, the device is subjected to thermal oxidation so as to form a layer 72 of SiO$_2$ over the exposed surfaces of these regions to a thickness in the range of about 1,000–5,000 Angstroms. Layer 72 is not formed, of course, over the exposed surfaces of the device or over the tops of studs 48, 50, 52 which are protected by the nitride. This last-described process of thermal oxidation further operates on the device of FIG. 1 to drive impurities from regions 66A, 66B, 68A, 68B, and 70 downward into the device, deepening and completing the formation of the source, drain regions 54A, 54B, the source, drain regions 56A, 56B, and the extrinsic base region 58.

Figure 16:
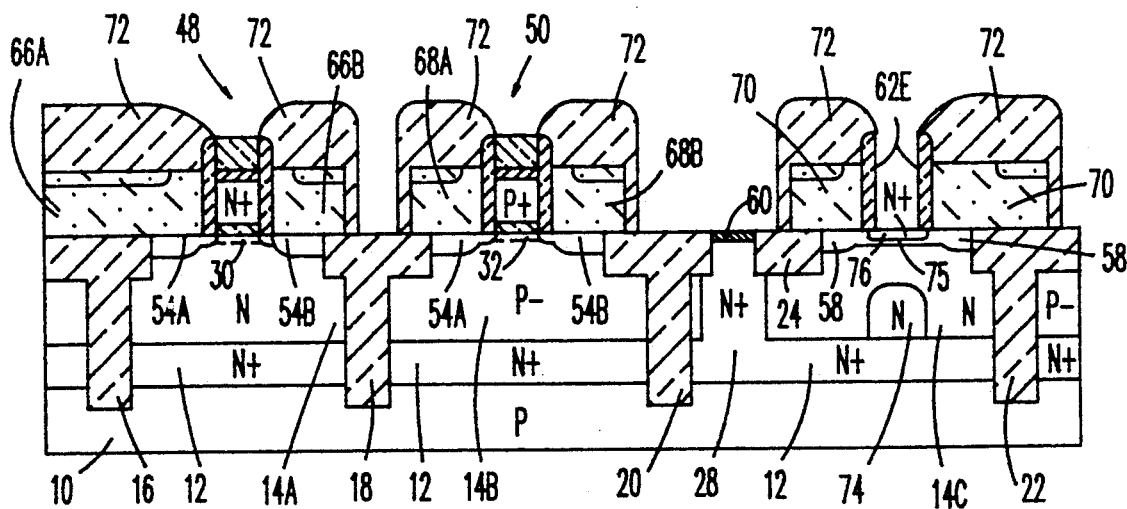

Referring now to FIG. 16, stud 52 over well 14C is removed to leave sidewall 62E bounding an exposed area on the well surface. Stud 52 is removed by first etching nitride layer 40 with a CF$_4$/O$_2$ plasma etch or a hot bath of phosphoric acid (H$_3$PO$_4$). The relatively thin layer 38 of silicon dioxide is removed by dipping in BHF without substantially disturbing the much thicker layer 72 and sidewall 62E of silicon dioxide. Polysilicon layer 36 is removed, for example, with a pyrocathecal etch, and silicon dioxide layer 34 is removed with BHF. It will be appreciated that the step of removing silicon dioxide layer 34 with a BHF dip etch can be carefully controlled to stop at the surface of well 14C so as not to etch into the device surface or otherwise disturb the nature of the subsequently formed bipolar transistor.

Subsequent to the removal of stud 52, a buried subcollector implant region 74 is formed in well 14C by a conventional implantation of arsenic or phosphorus ions. Because the remainder of the device is masked by polysilicon regions 66A, 66B, 68A, 68C, 70, overlying layer 72, and studs 48, 50, this implantation is effective only in the window opened within sidewall 62E by the removal of stud 52. The surface of subcollector reachthrough 28 is exposed to the implantation. However, the dopant concentration of subcollector reachthrough region 28 is sufficiently larger than that of subcollector region 74 so it is not appreciably altered.

Following the formation of buried subcollector region 74, a conventional, blanket implantation of Boron ions is performed with a dose in the range of $1$–$10 \times 10^{12}$ atoms/cm$^2$ to form an intrinsic base region 75.

After the formation of intrinsic base region 75, a conventional, blanket implantation of Arsenic ions is performed with a dose in the range of $1$–$10 \times 10^{15}$ atoms/cm$^2$ to form an emitter region 76. Alternatively, emitter region 76 can be out-diffused from the emitter polysilicon deposited as described hereinbelow, or from a combination of both of these processes. It will be understood that buried region 74, intrinsic base region 75, and emitter region 76 can be formed in interchangeable order.

In each of the above-described implantation steps, the polysilicon regions 66A, 66B, 68A, 68C, 70, overlying layer 72, and studs 48, 50 function as implant blocking masks, in the manner described above, to block the Boron and Arsenic ions from entering the underlying device regions. Also in the manner described above, the dopant concentration of subcollector reachthrough region 28 is sufficiently high that it is left effectively undisturbed.

Figure 17:
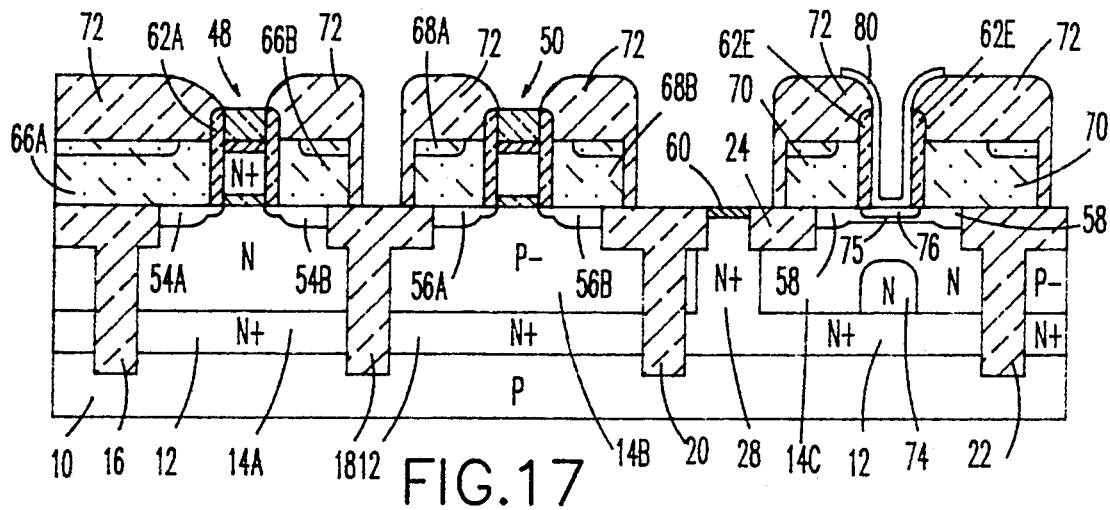

Referring now to FIG. 17, a layer 80 of in situ arsenic doped polysilicon, having a concentration in the range of about $1$–$10 \times 10^{20}$ atoms/cm$^3$, is formed over the exposed inner surface of sidewall 62E and overlying emitter region 76. Subsequent to the formation of layer 80, a layer 82 of metal silicide is formed thereover in the manner shown in FIG. 18 to increase the conductivity of layer 80. Alternately, layer 80 can comprise an intrinsic polysilicon later doped by a conventional implantation with arsenic ions to a concentration in the range of about $1$–$10 \times 10^{20}$ atoms/cm$^3$. Layer 80 is formed, for example, by a low pressure CVD process. Layer 82 is formed, for example, by physically evaporating or sputtering a thin layer of metal, for example titanium, over layer 80, and converting it into a metal silicide using an alloy sintering anneal. If it is desired to form emitter region 75 from, or increase the concentration of the emitter region by out-diffusion from layer 80, then an emitter dopant drive-in anneal, in a temperature range of about 800–950 degrees centigrade, is performed prior to the formation of layer 82.

Figure 18:
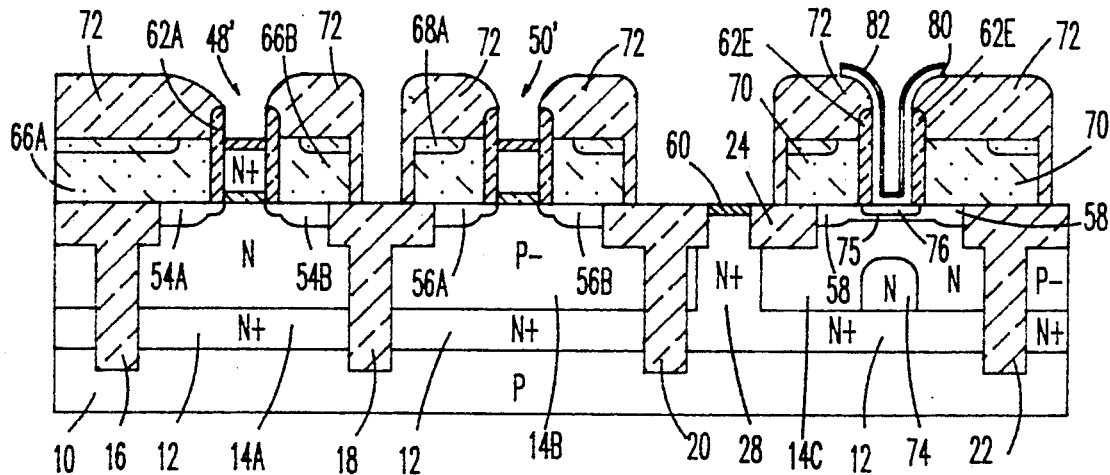

Continuing to describe FIG. 18, the nitride cap layers 40 on the tops of studs 48, 50 are remove with a phosphoric acid etch (H$_3$PO$_4$) to leave thusly altered studs 48', 50', respectively.

Figure 19:
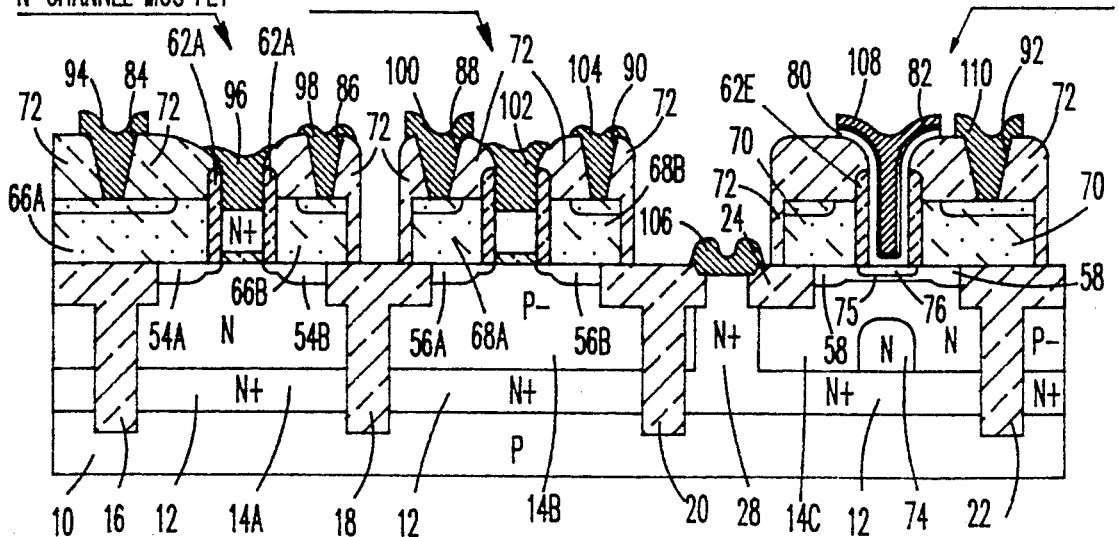

Referring now to FIG. 19, conventional processes are used to form contact holes 84, 86, 88, 90, and 92 through layer 72 to expose surface areas of polysilicon regions 66A, 66B, 68A, 68B, and 70, respectively. Conventional processes are again used to form metal interconnections 94, 96, 98, 100, 102, 104, 106, 108, and 110. Metal contacts 94, 98, 100, 104, and 110 are disposed in contact holes 84, 86, 88, 90, and 92, respectively. Metal contacts 96 and 102 overlie polysilicon layer 38 in studs 48', 50', respectively. Metal contact 106 spans isolation regions 20, 24 so as to overlie subcollector reachthrough region 28, and metal contact 108 overlies polycide layer 82 over well 14C. Each of the metal interconnections described above makes ohmic electrical contact with the underlying, contacted region.

In accordance with the above-described embodiment of the invention, there has thus been formed an N-channel MOSFET in the region of isolated device well 14A, a P-channel MOSFET in the region of isolated device well 14B, and a vertically disposed NPN bipolar transistor in the region of isolated device well 14C. Metal contacts 96, 98, and 94 form the gate, drain and source of the first MOSFET, respectively. Metal contacts 102, 104, and 100 form the gate, drain, and source contacts of the second MOSFET, respectively, and metal contacts 108, 110, and 106 form the emitter, base, and collector of the bipolar transistor, respectively. The thusly formed BICMOS logic is fabricated with a cost-effective number of process steps. In accordance with one major feature of the present invention, the use of studs 48, 50, 52 to act as masks for the various device regions, in combination with the forming and delineation of polysilicon layer 64 to form device contact regions 66A, 66B, 68A, 68B, and 70A, 70B, results in self-aligned, electrically conductive contacts for the CMOS and bipolar transistors. These self-aligned features, formed in accordance with the reverse image process of the present invention, provide improvement in process control and fabrication reproducibility. They further provide significant increases in the speed and the reliability of the resulting transistors. In accordance with another major feature of the present invention, the use of the silicon dioxide sidewalls 62 in the manner described above provides very close spacing, i.e. on the order of 0.1–0.5 microns, between the base and emitter contacts of the NPN transistor and between the gate and source/drain contacts of the CMOS transistors. This provides the significant advantages of decreased size, increased density, and significantly increased speed of the integrated circuits. It will be appreciated that device contact regions 66A, 66B, 68A, 68B function as extrinsic drain/source regions, and device contact regions 70A, 70B function as extrinsic base regions.

There is thus provided a BICMOS logic circuit and a method of forming the same. The circuit includes densely packed, high-speed devices formed by a combination of reverse image and self-aligned process steps. The process used to form the BICMOS logic circuit is readily adaptable to the formation of other types of logic circuits, including exclusive bipolar or CMOS devices, and other semiconductor devices which can benefit from the self-alignment techniques of the present invention. The process has particular industrial application in the formation of highly integrated logic circuits.

While the present invention has been shown and described with respect to particular embodiments, numerous changes, modifications, and improvements will occur to those skilled in the art without departing from the scope and spirit of the invention.

What is claimed is:

1. A method of forming at least one bipolar and two complementary metal oxide semiconductor transistors (BICMOS) comprising the steps of:
    providing a body of semiconductor material including first, second, and third electrically isolated device regions, said first and second device regions adjacent each other and of opposite conductivity types;
    forming first, second, and third studs over said first, second and third device regions, respectively, such that said first and second studs bisect said first and second device regions;
    using said first and second studs as masks to form first and second doped regions adjoining opposite sides of said first and second studs in each of said first and second device regions, respectively, each of said first and second doped regions of opposite conductivity type to its associated device region;
    forming first, second, and third insulating sidewalls on said first, second, and third studs, respectively;
    forming a layer of conductive material generally conformally over said semiconductor body, said studs, and said sidewalls to a depth at least equal to the height of said sidewalls;
    planarizing by chemically-mechanically polishing said layer of conductive material to a height generally equal to or less than the height of said sidewalls; and
    patterning the planarized layer of conductive material, whereby to form spaced apart first and second contacts overlying said first and second doped regions in each of said first and second device regions, respectively, and an extrinsic base contact overlying said third device region;
    removing said third stud while leaving the sidewall associated with said third stud to expose a portion of said third device region;
    using said third sidewall as a mask to form, by out-diffusion from a solid dopant source, an intrinsic base region of opposite conductivity type to said third device region in the surface of said third device region; and
    forming a vertical bipolar transistor in said third device region and first and second insulated gate transistors in said first and second device regions, respectively.

2. A method in accordance with claim 1 and further including the step of using said third stud as a mask to form an extrinsic base link-up region of opposite conductivity type to said third device region adjoining said third stud in said third device region.

3. A method in accordance with claim 2 and further including the steps of annealing said body of semiconductor material to drive dopant from said layer of conductive material into said link-up region whereby to complete an extrinsic base region.

4. A method in accordance with claim 2 wherein said step of using said studs as masks to form said first and second doped regions and aid extrinsic base link-up region includes the steps of:
    masking a selected one of said device regions while depositing dopant impurities into the unmasked device regions;
    removing the mask from the selected one of said device regions; and
    masking the remaining two device regions while depositing dopant impurities into the selected one of said device regions.

5. A method in accordance with claim 1 wherein said layer of conductive material comprises a doped polysilicon, a polycide, or a refractory metal.

6. A method in accordance with claim 1 and further including the step of using said third sidewall as a mask to form a third doped region of same conductivity type as said third device region in said intrinsic base region.

7. A method in accordance with claim 1 wherein said step of forming said studs includes the steps of:
    forming a first layer of insulating material generally conformally over said semiconductor body;
    forming a second layer of conducting material over said first layer;
    forming a third layer of material over said second layer; and
    removing portions of said first, second, and third layers to delineate said studs.

8. A method in accordance with claim 7 wherein:
    said first layer comprises an oxide;
    said second layer comprises a doped polysilicon, a refractory metal, or a polycide; and
    said third layer comprises a nitride.

9. A method in accordance with claim 7 and further including the step of removing said third layer of material in each of said first and second studs whereby to form an electrical connection to said second layer of conductive material.

10. A method in accordance with claim 1 wherein said step of forming said sidewalls includes the steps of:
    forming a layer of insulating material generally conformally over said semiconductor body and said studs; and anisotropically etching said layer of insulating material to form said studs.

11. A method in accordance with claim 1 and further including the step of forming an electrical contact on the exposed portion of said third doped region.

12. A method in accordance with claim 1 and further including the step of using said third sidewall as a mask to form a buried implant region of said first conductivity type in said third device region.

13. A method in accordance with claim 1 and further including the steps of:
    forming a fourth doped region of said first conductivity type underneath said first doped region; and forming a reachthrough region of said first conductivity type extending from the surface of said semiconductor body to said fourth doped region, said reachthrough region insulated from said extrinsic base region.

14. A method in accordance with claim 1 wherein said body of semiconductor material comprises silicon semiconductor material.

* * * * *